United States Patent
Li et al.

(10) Patent No.: US 12,557,626 B2
(45) Date of Patent: Feb. 17, 2026

(54) SELF-ALIGNED BACKSIDE CONTACT WITH DEEP TRENCH LAST FLOW

(71) Applicant: International Business Machines Corporation, Armonk, NY (US)

(72) Inventors: Tao Li, Slingerlands, NY (US); Ruilong Xie, Niskayuna, NY (US); Kisik Choi, Watervliet, NY (US); Brent A. Anderson, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 683 days.

(21) Appl. No.: 17/933,861

(22) Filed: Sep. 21, 2022

(65) Prior Publication Data

US 2024/0096751 A1 Mar. 21, 2024

(51) Int. Cl.
*H01L 23/48* (2006.01)
*H10D 84/01* (2025.01)
*H10D 84/03* (2025.01)

(52) U.S. Cl.
CPC ......... *H01L 23/481* (2013.01); *H10D 84/013* (2025.01); *H10D 84/0149* (2025.01); *H10D 84/038* (2025.01)

(58) Field of Classification Search
CPC ............ H10D 84/013; H10D 84/0149; H10D 30/6735; H10D 84/038; H10D 30/014; H10D 64/017; H01L 23/481
See application file for complete search history.

(56) References Cited

U.S. PATENT DOCUMENTS

| | | |
|---|---|---|
| 9,466,723 B1 | 10/2016 | Huang |
| 10,903,315 B2 | 1/2021 | Loubet et al. |
| 2021/0111115 A1 | 4/2021 | Patrick |
| 2021/0134721 A1 | 5/2021 | Chiang et al. |
| 2021/0202385 A1 | 7/2021 | Huang |
| 2021/0305252 A1 | 9/2021 | Chiang et al. |
| 2021/0305381 A1 | 9/2021 | Chiang et al. |
| 2021/0336019 A1 | 10/2021 | Su |
| 2021/0351079 A1 | 11/2021 | Su |
| 2021/0351303 A1 | 11/2021 | Ju et al. |
| 2021/0376071 A1 | 12/2021 | Liu et al. |
| 2021/0376093 A1 | 12/2021 | Chu et al. |
| 2021/0391421 A1 | 12/2021 | Chu |
| 2021/0399099 A1 | 12/2021 | Chu |
| 2023/0012147 A1* | 1/2023 | Chu .................. H10D 30/43 |

FOREIGN PATENT DOCUMENTS

EP 3671825 A1 6/2020

* cited by examiner

*Primary Examiner* — Changhyun Yi
(74) *Attorney, Agent, or Firm* — CANTOR COLBURN LLP; Samuel Waldbaum

(57) ABSTRACT

A semiconductor device includes first source/drain (S/D) epitaxy and a second S/D epitaxy and a gate contact. The device also includes a back end of the line (BEOL) layer electrically connected to the first S/D epitaxy and the gate contact on a top side of the device and a wafer that carries the BEOL layer and is on the top side of the device. The device also includes a backside trench epitaxy formed through and contacting portions of the second S/D epitaxy and a backside power distribution network electrically coupled to the backside trench epitaxy and disposed on the bottom of the device.

11 Claims, 17 Drawing Sheets

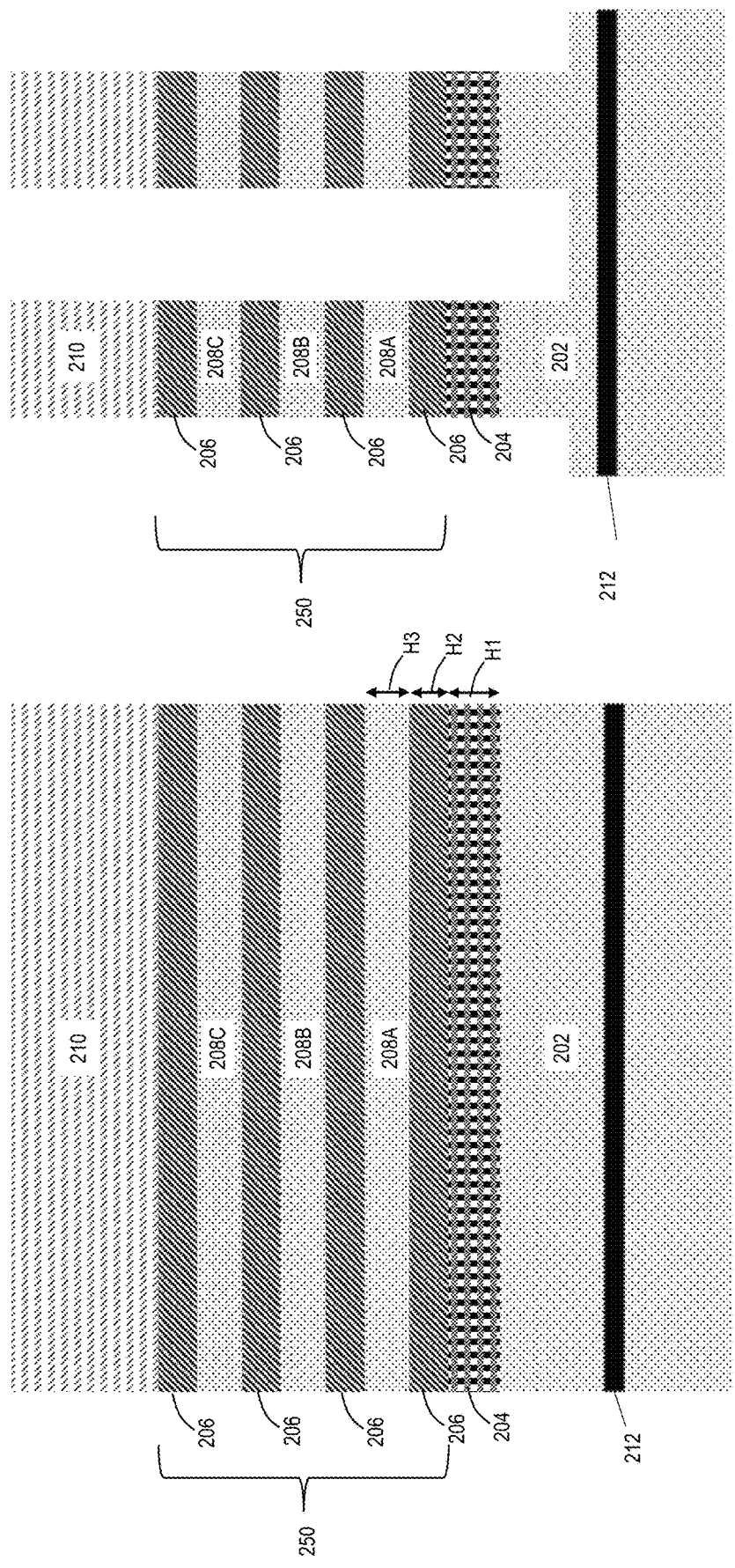

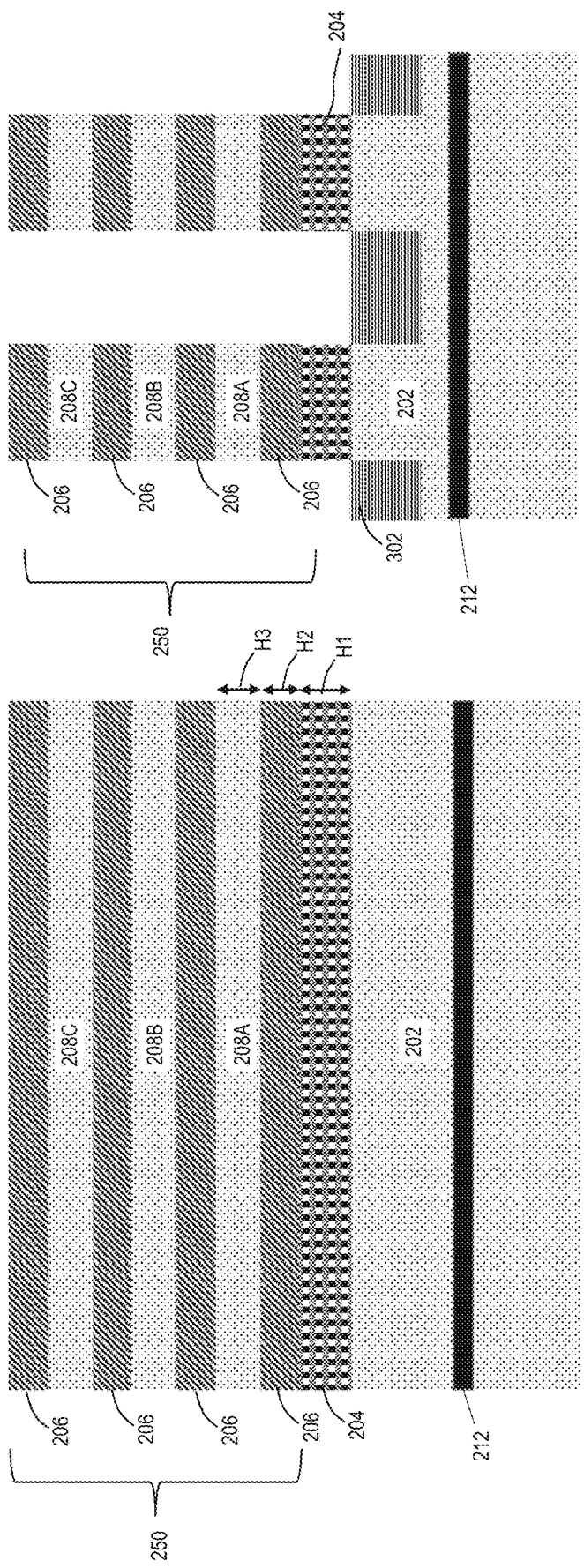

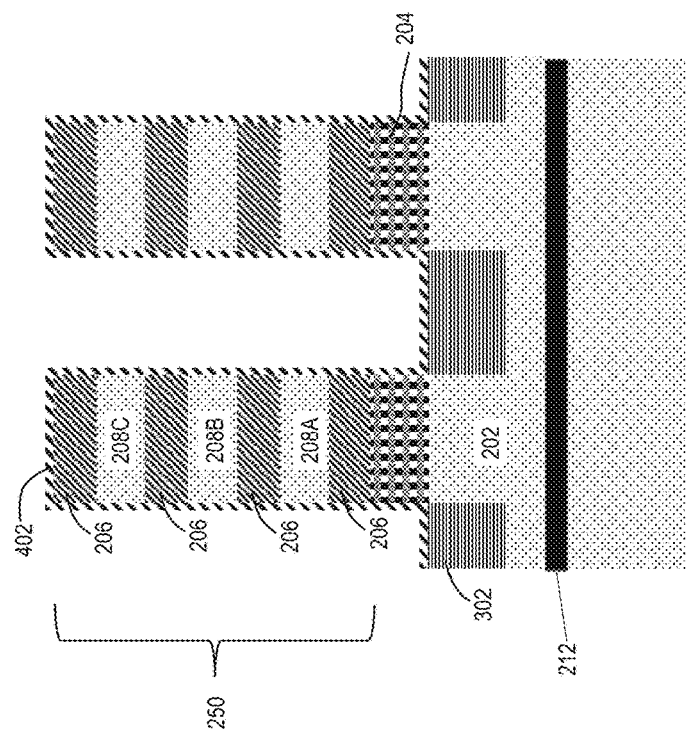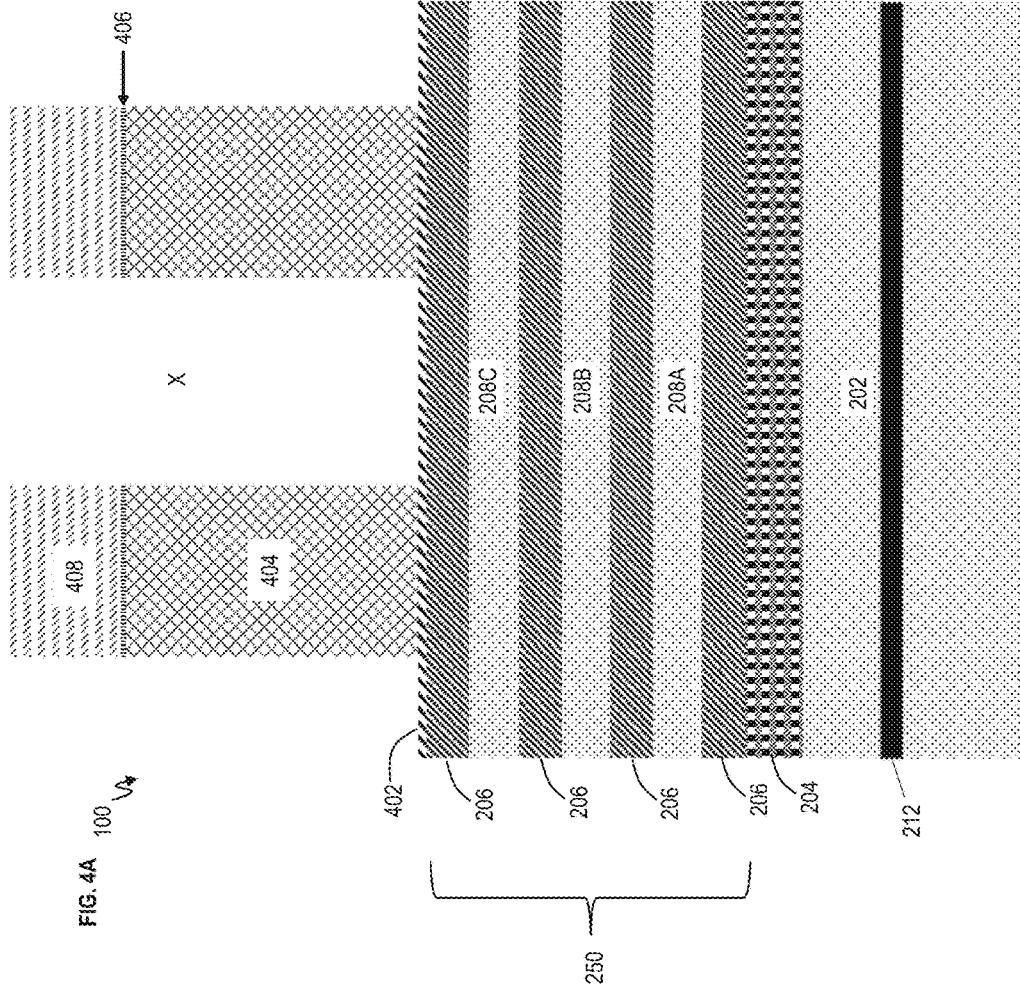

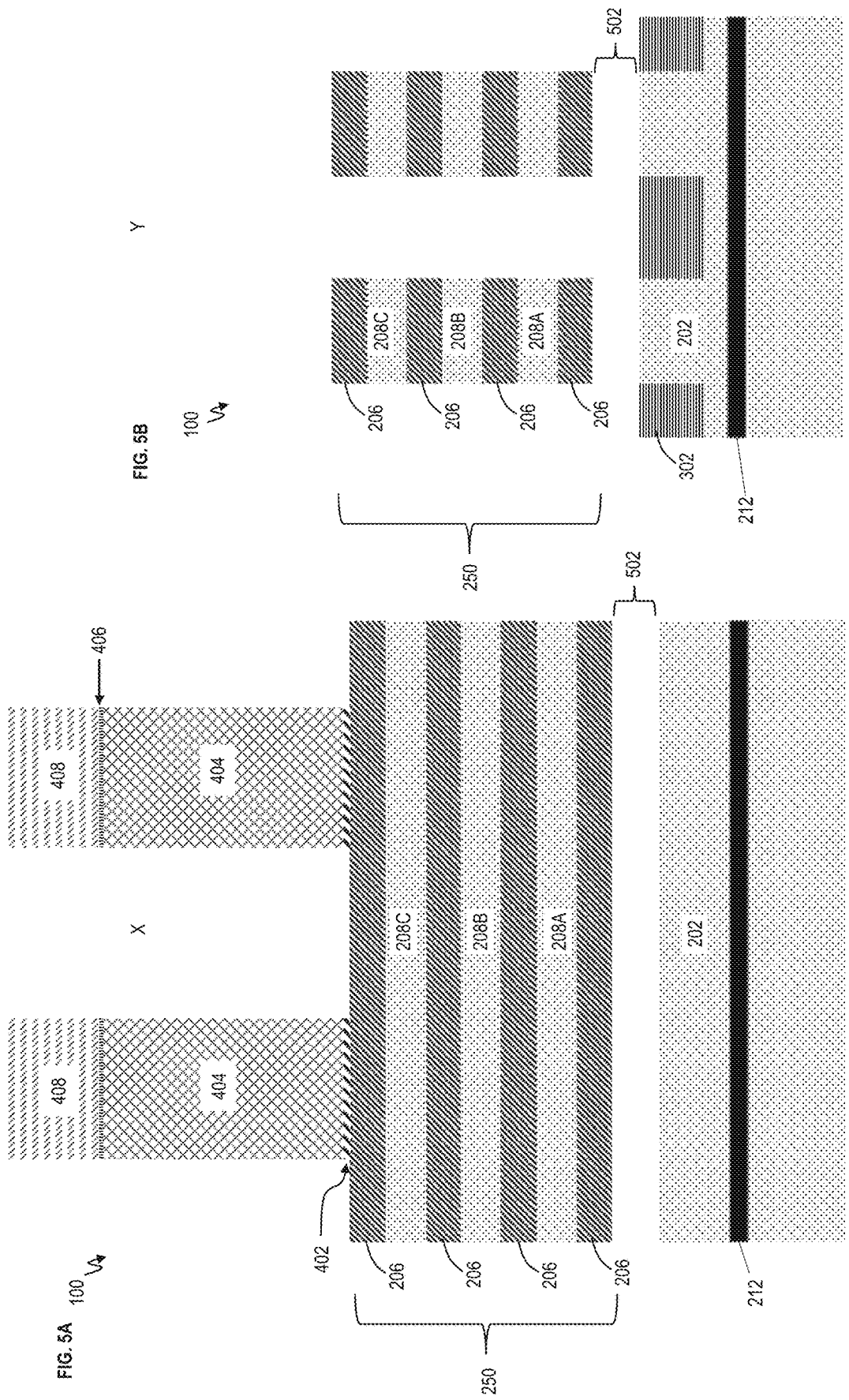

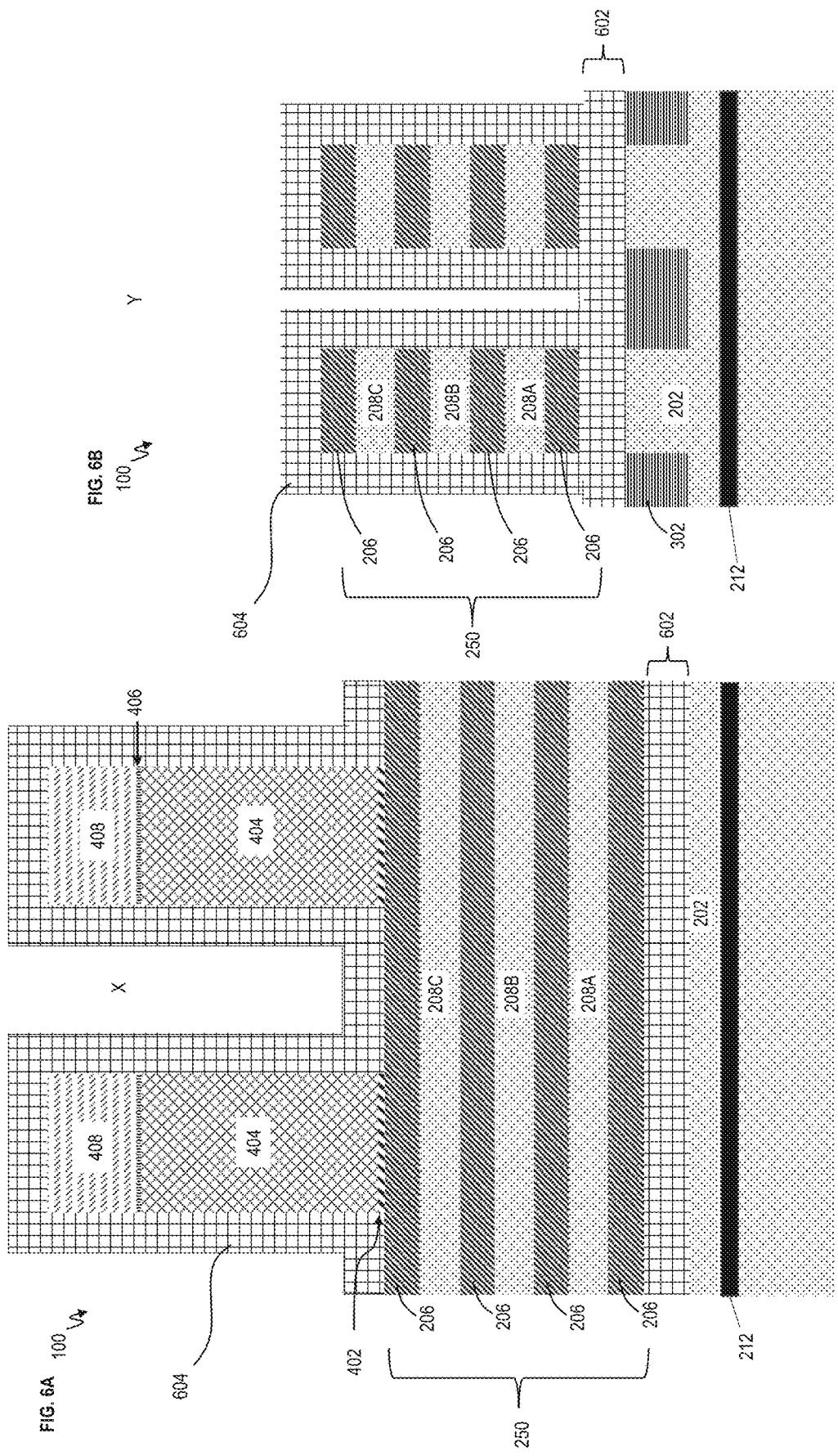

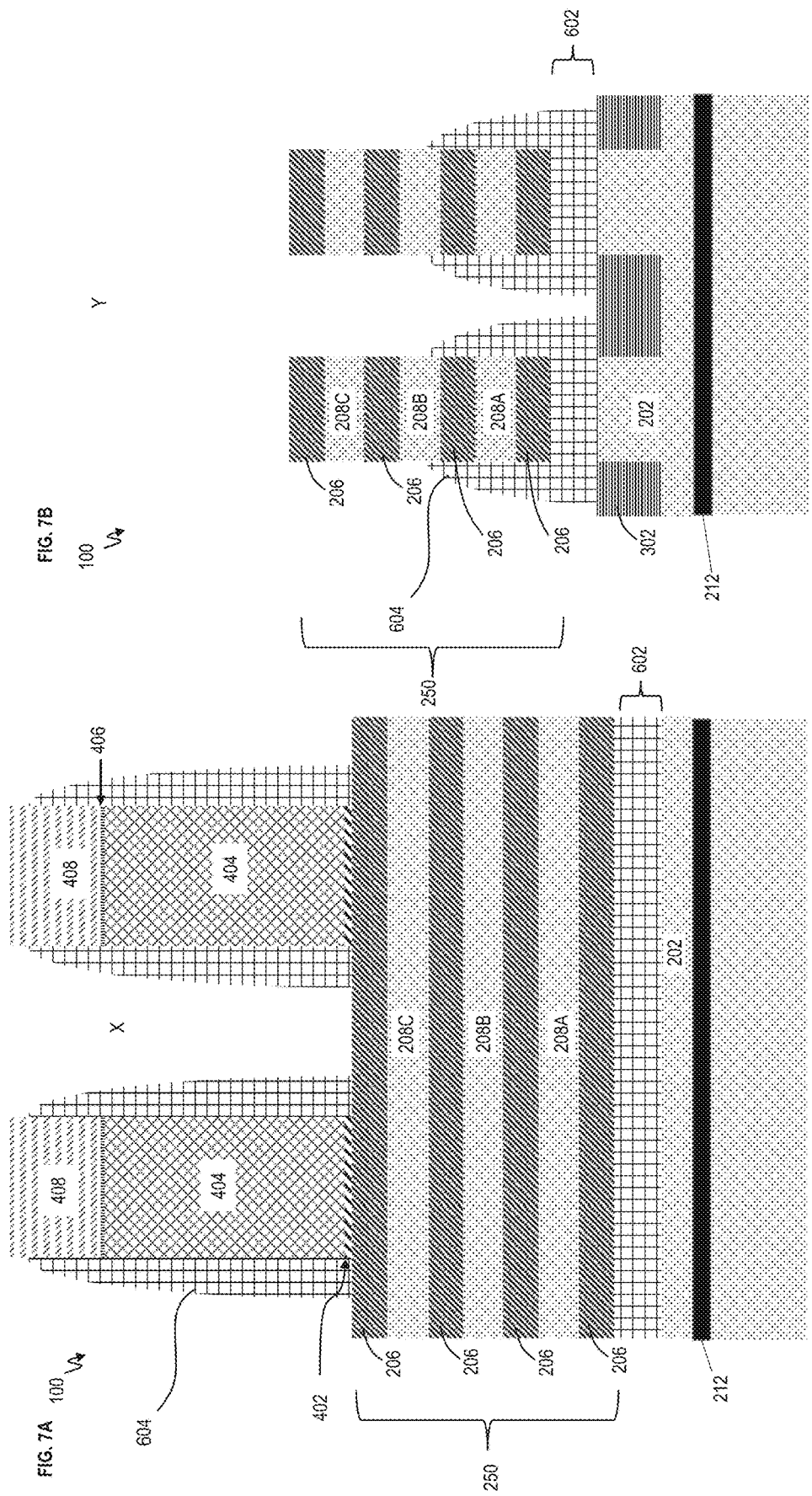

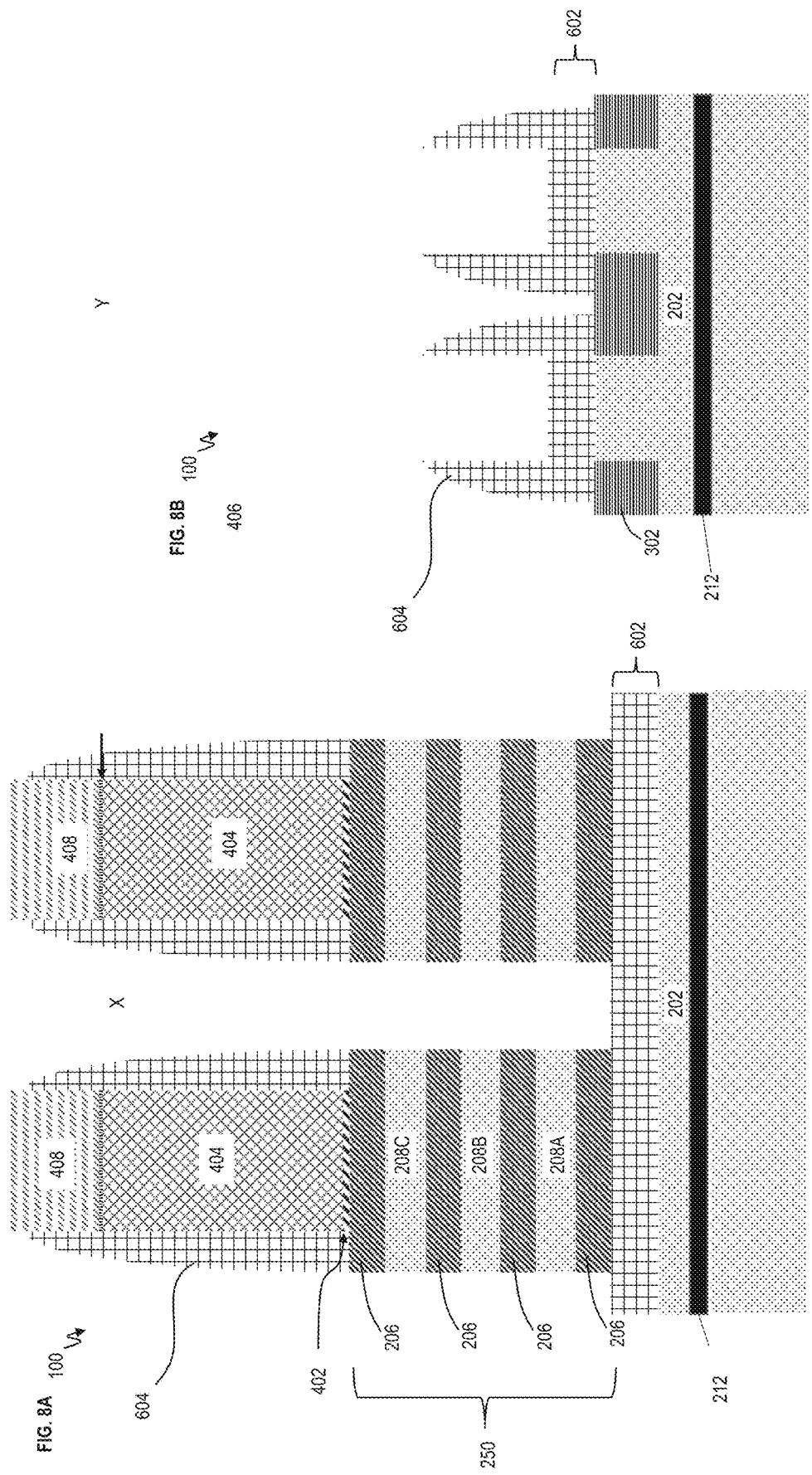

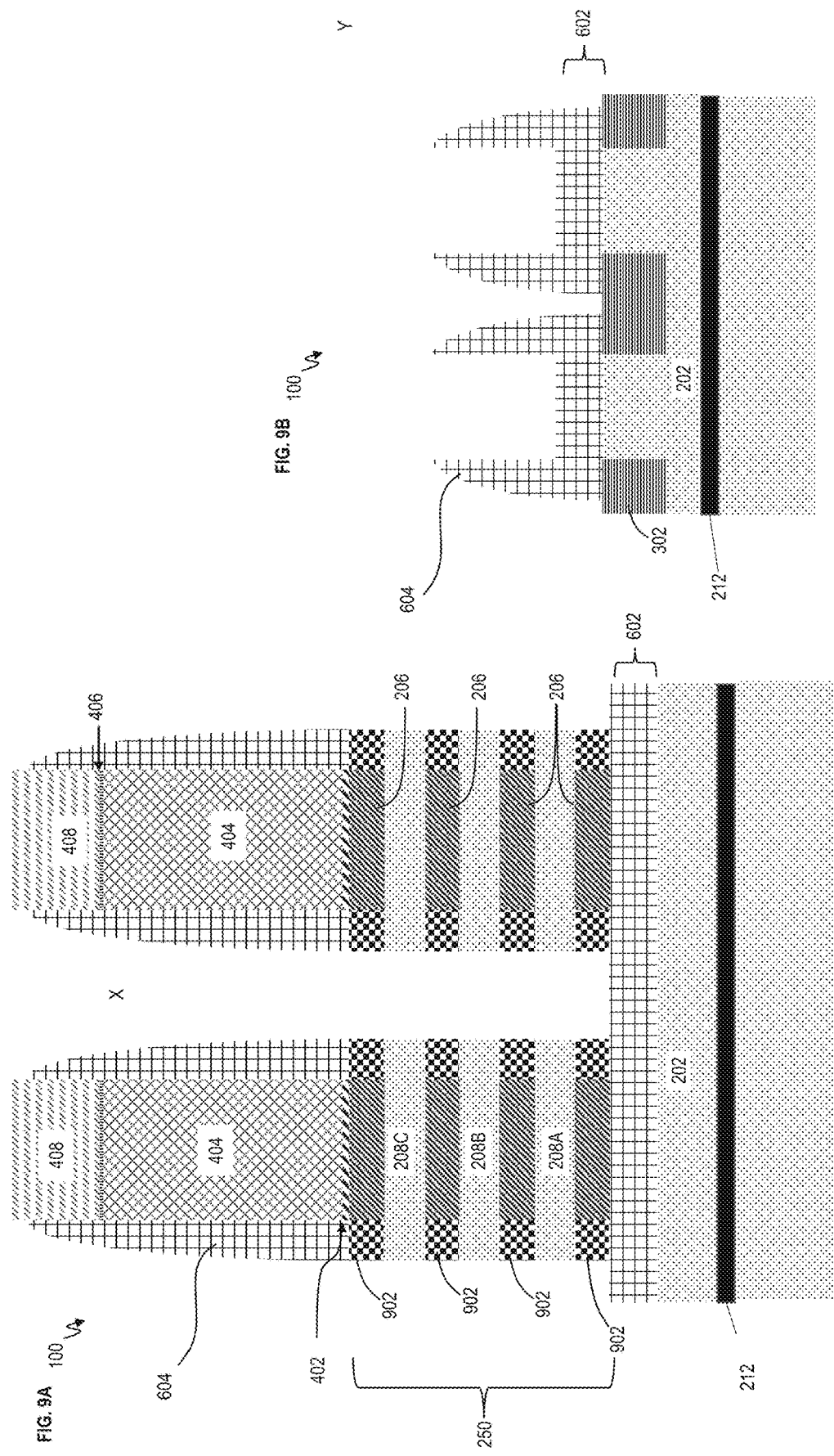

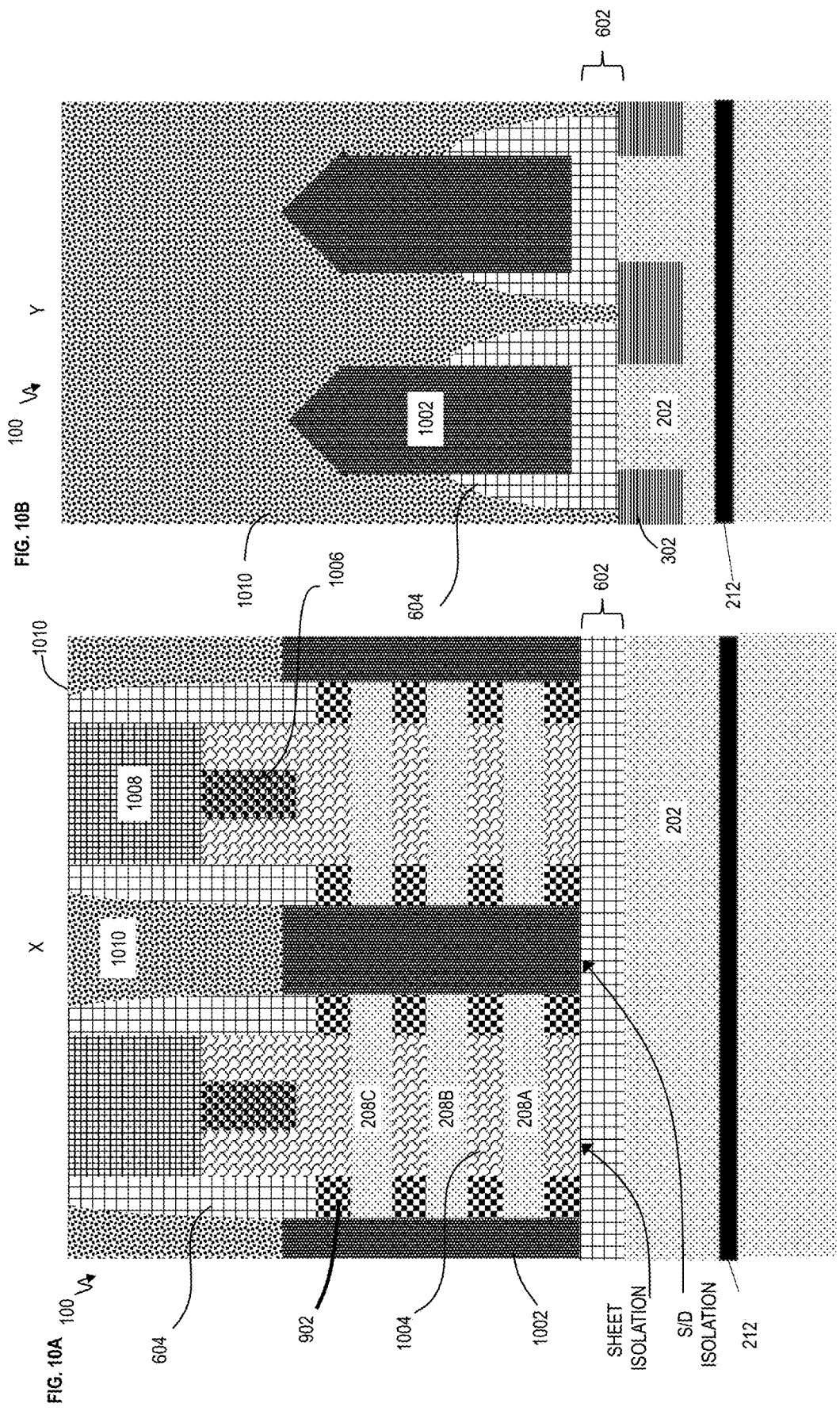

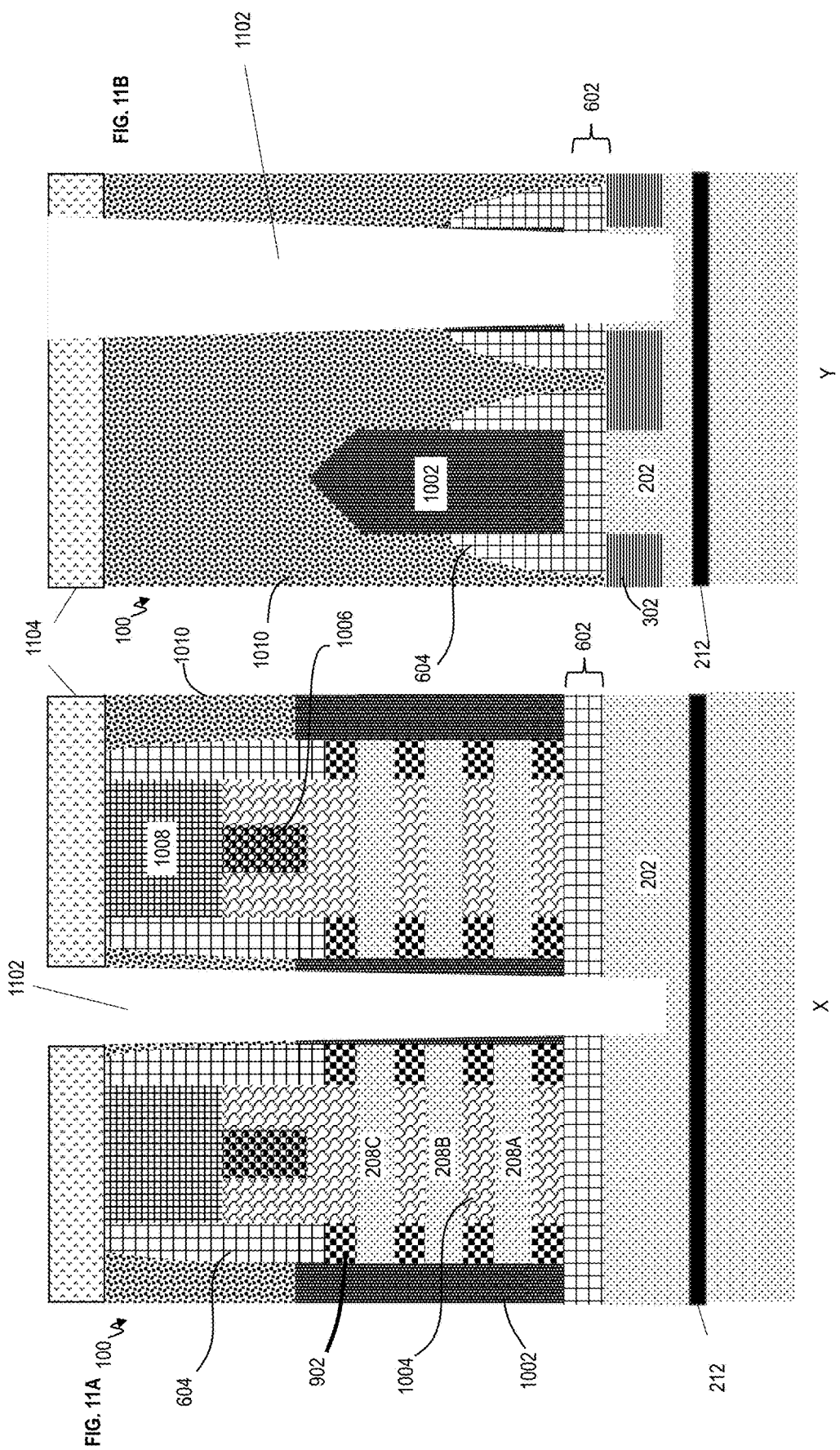

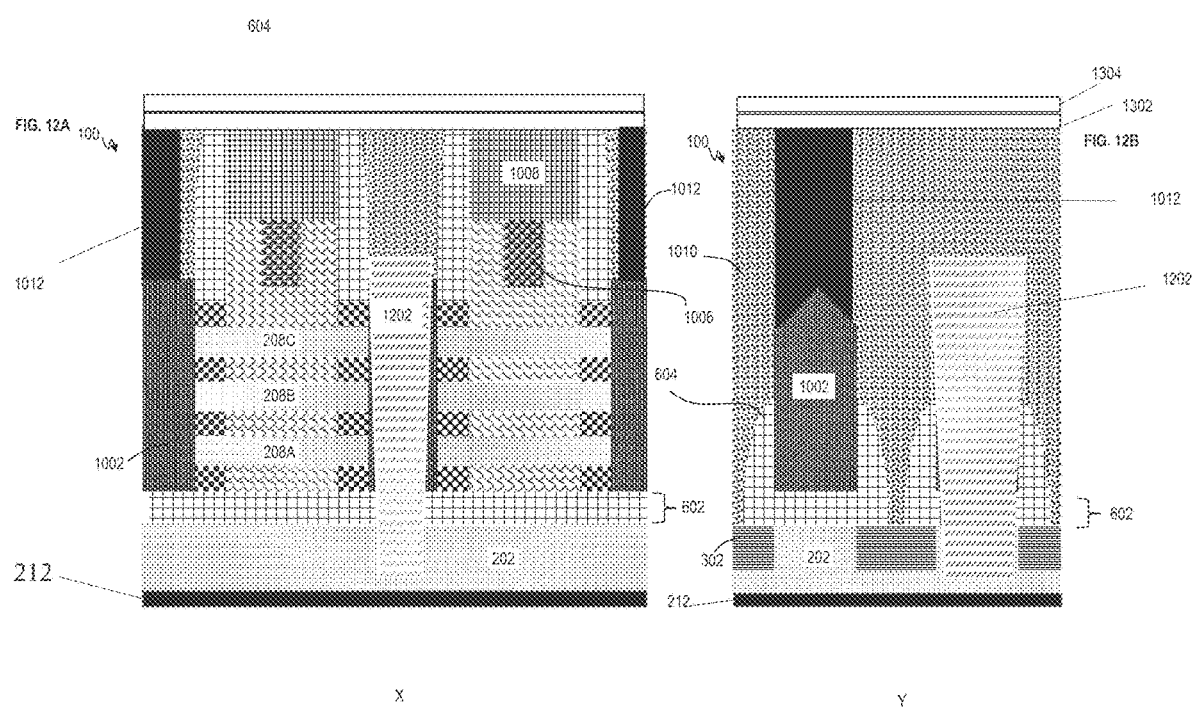

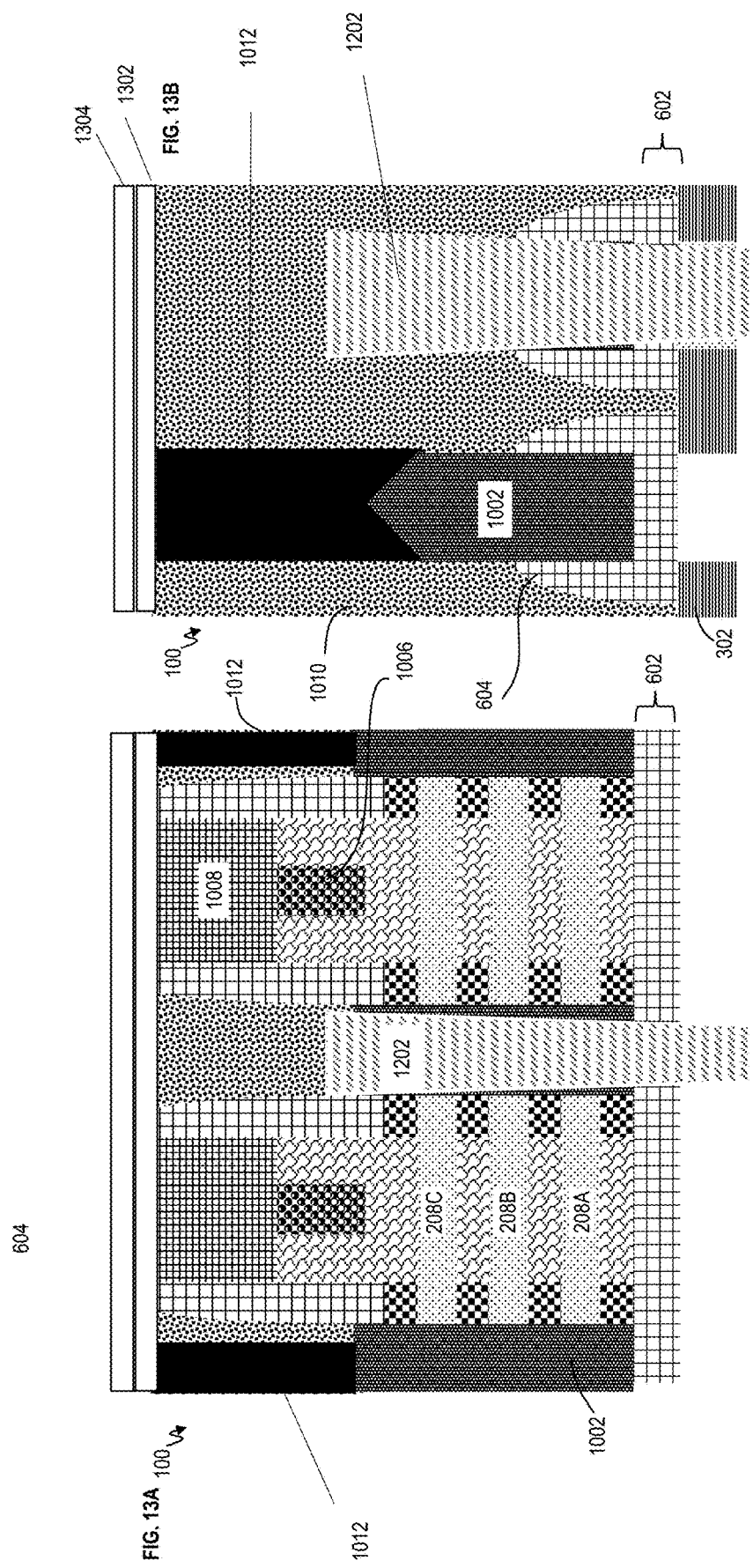

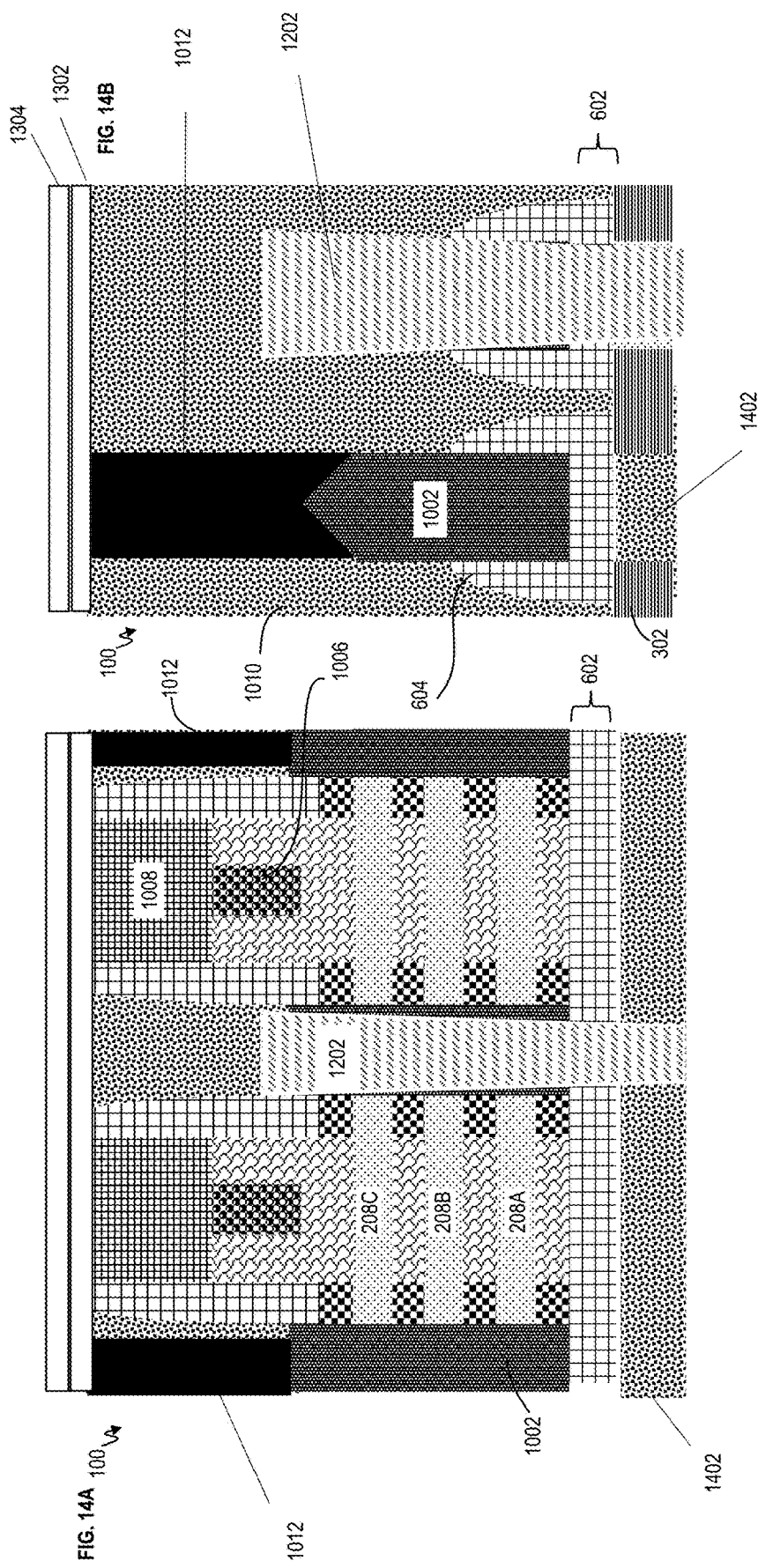

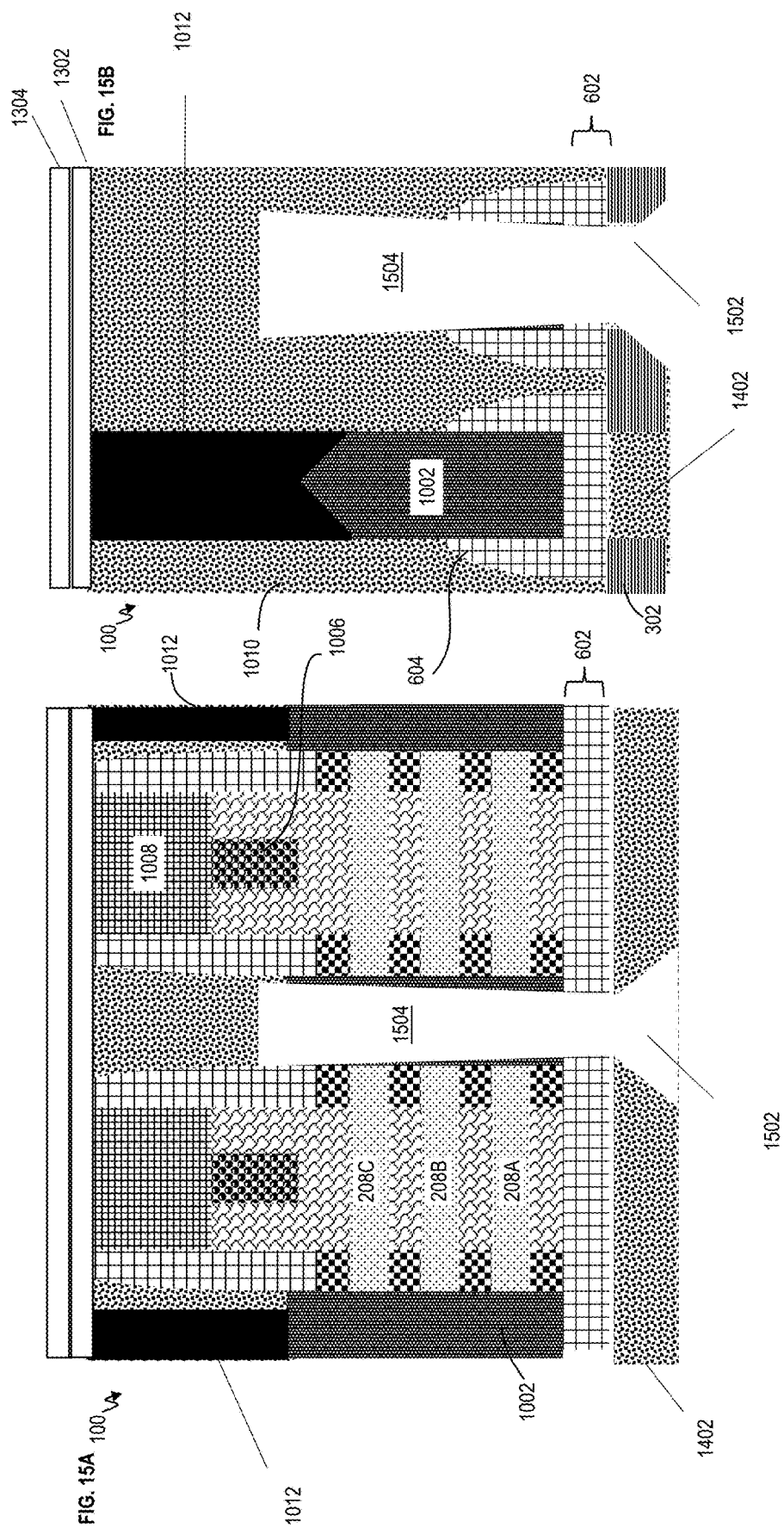

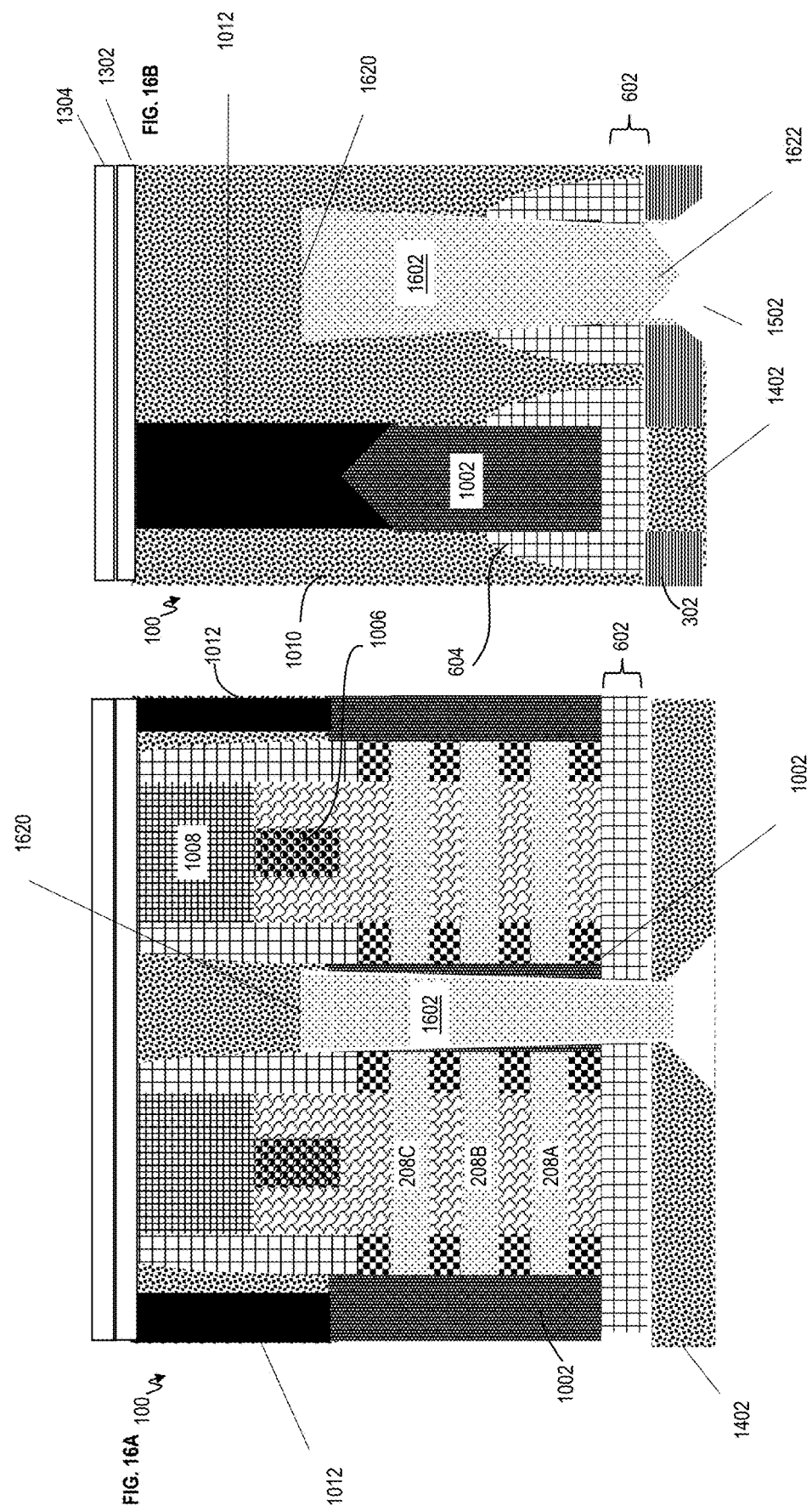

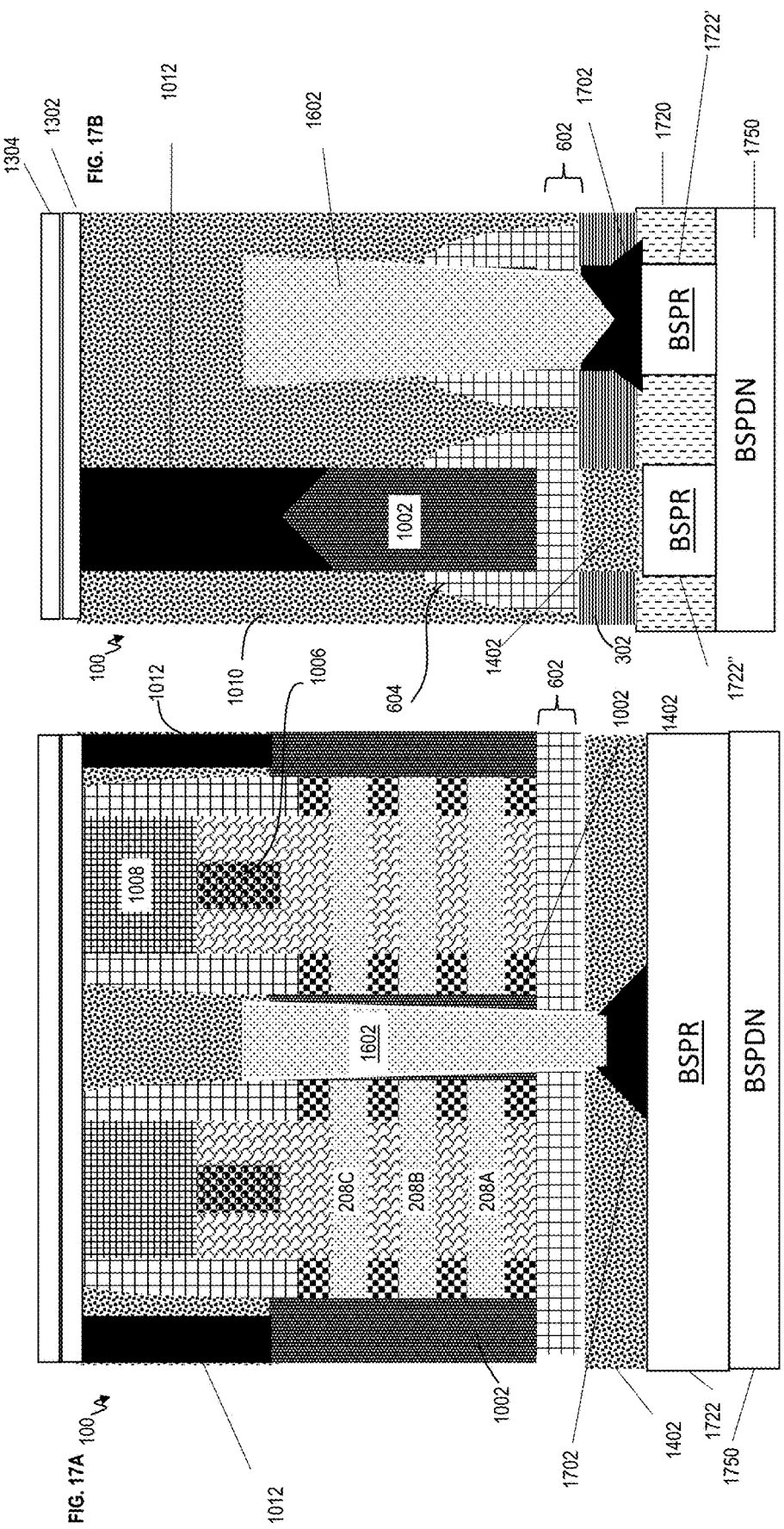

SELF-ALIGNED BACKSIDE CONTACT WITH DEEP TRENCH LAST FLOW

BACKGROUND

The present invention generally relates to fabrication methods and resulting structures for semiconductor devices, and more specifically, to formation of semiconductor device that includes a self-aligned backside contact.

A metal-oxide-semiconductor field-effect transistors (MOSFET) is used for amplifying or switching electronic signals. The MOSFET has a source, a drain, and a metal oxide gate electrode. The metal gate portion of the metal oxide gate electrode is electrically insulated from the main semiconductor n-channel or p-channel by a thin layer of insulating material, for example, silicon dioxide or glass, which makes the input resistance of the MOSFET relatively high. The gate voltage controls whether the current path from the source to the drain is an open circuit ("off") or a resistive path ("on"). N-type field effect transistors (NFET) and p-type field effect transistors (PFET) are two types of complementary MOSFETs. The NFET includes n-doped source and drain junctions and uses electrons as the current carriers. The PFET includes p-doped source and drain junctions and uses holes as the current carriers. Complementary metal oxide semiconductor (CMOS) is a technology that uses complementary and symmetrical pairs of p-type and n-type MOSFETs to implement logic functions.

As devices be more dense on a substrate, it may be beneficial to separate some lines (e.g., power) from other lines (e.g., data) by placing one type on one side (e.g., top) of the device and one on another (e.g., bottom).

SUMMARY

Embodiments of the invention are directed to a method for forming a semiconductor device and the device.

In one embodiment, the device includes a first source/drain (S/D) epitaxy and a second S/D epitaxy and a gate contact and a back end of the line (BEOL) layer electrically connected to the first S/D epitaxy and the gate contact on a top side of the device. The device also includes a wafer that carries the BEOL layer and is on the top side of the device, a backside trench epitaxy formed through and contacting portions of the second S/D epitaxy, and a backside power distribution network electrically coupled to the backside trench epitaxy and disposed on the bottom of the device.

Also disclosed is a method of forming a semiconductor device. The method includes: providing a substrate that includes an etch stop layer disposed therein; forming gate, drain and source epitaxy regions on the substrate; forming a backside contact trench opening through one of the source epitaxy region or the drain epitaxy region; filling at least a portion of the backside contact trench with a sacrificial material; attaching a carrier wafer over the gate, drain and source epitaxy regions; removing the substrate; forming a backside ILD on a bottom of the device such that it the sacrificial material is exposed to produce an intermediate workpiece; removing the sacrificial material to form a cavity; growing backside trench epitaxy in the cavity; and forming backside contact metallization.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 2A depicts a cross-sectional view of the semiconductor device taken along line X in FIG. 1 after an initial set of fabrication operations according to embodiments of the invention;

FIG. 2B depicts a cross-sectional view of the semiconductor device taken along line Y in FIG. 1 after an initial set of fabrication operations according to embodiments of the invention;

FIG. 3A depicts a cross-sectional view of the semiconductor device taken along line X (shown in FIG. 1) after fabrication operations according to embodiments of the invention;

FIG. 3B depicts a cross-sectional view of the semiconductor device taken along line Y (shown in FIG. 1) after fabrication operations according to embodiments of the invention;

FIG. 4A depicts a cross-sectional view of the semiconductor device taken along line X (shown in FIG. 1) after fabrication operations according to embodiments of the invention;

FIG. 4B depicts a cross-sectional view of the semiconductor device taken along line Y (shown in FIG. 1) after fabrication operations according to embodiments of the invention;

FIG. 5A depicts a cross-sectional view of the semiconductor device taken along line X (shown in FIG. 1) after fabrication operations according to embodiments of the invention;

FIG. 5B depicts a cross-sectional view of the semiconductor device taken along line Y (shown in FIG. 1) after fabrication operations according to embodiments of the invention;

FIG. 6A depicts a cross-sectional view of the semiconductor device taken along line X (shown in FIG. 1) after fabrication operations according to embodiments of the invention;

FIG. 6B depicts a cross-sectional view of the semiconductor device taken along line Y (shown in FIG. 1) after fabrication operations according to embodiments of the invention;

FIG. 7A depicts a cross-sectional view of the semiconductor device taken along line X (shown in FIG. 1) after fabrication operations according to embodiments of the invention;

FIG. 7B depicts a cross-sectional view of the semiconductor device taken along line Y (shown in FIG. 1) after fabrication operations according to embodiments of the invention;

FIG. 8A depicts a cross-sectional view of the semiconductor device taken along line X (shown in FIG. 1) after fabrication operations according to embodiments of the invention;

FIG. 8B depicts a cross-sectional view of the semiconductor device taken along line Y (shown in FIG. 1) after fabrication operations according to embodiments of the invention;

FIG. 9A depicts a cross-sectional view of the semiconductor device taken along line X (shown in FIG. 1) after fabrication operations according to embodiments of the invention;

FIG. 9B depicts a cross-sectional view of the semiconductor device taken along line Y (shown in FIG. 1) after fabrication operations according to embodiments of the invention;

FIG. 10A depicts a cross-sectional view of the semiconductor device taken along line X (shown in FIG. 1) after fabrication operations according to embodiments of the invention;

FIG. 10B depicts a cross-sectional view of the semiconductor device taken along line Y (shown in FIG. 1) after fabrication operations according to embodiments of the invention FIG. 11A depicts a cross-sectional view of the semiconductor device taken along line X (shown in FIG. 1) after fabrication operations according to embodiments of the invention;

FIG. 11B depicts a cross-sectional view of the semiconductor device taken along line Y (shown in FIG. 1) after fabrication operations according to embodiments of the invention FIG. 12A depicts a cross-sectional view of the semiconductor device taken along line X (shown in FIG. 1) after fabrication operations according to embodiments of the invention;

FIG. 12B depicts a cross-sectional view of the semiconductor device taken along line Y (shown in FIG. 1) after fabrication operations according to embodiments of the invention;

FIG. 13A depicts a cross-sectional view of the semiconductor device taken along line X (shown in FIG. 1) after fabrication operations according to embodiments of the invention;

FIG. 13B depicts a cross-sectional view of the semiconductor device taken along line Y (shown in FIG. 1) after fabrication operations according to embodiments of the invention;

FIG. 14A depicts a cross-sectional view of the semiconductor device taken along line X (shown in FIG. 1) after fabrication operations according to embodiments of the invention;

FIG. 14B depicts a cross-sectional view of the semiconductor device taken along line Y (shown in FIG. 1) after fabrication operations according to embodiments of the invention;

FIG. 15A depicts a cross-sectional view of the semiconductor device taken along line X (shown in FIG. 1) after fabrication operations according to embodiments of the invention;

FIG. 15B depicts a cross-sectional view of the semiconductor device taken along line Y (shown in FIG. 1) after fabrication operations according to embodiments of the invention;

FIG. 16A depicts a cross-sectional view of the semiconductor device taken along line X (shown in FIG. 1) after fabrication operations according to embodiments of the invention;

FIG. 16B depicts a cross-sectional view of the semiconductor device taken along line Y (shown in FIG. 1) after fabrication operations according to embodiments of the invention;

FIG. 17A depicts a cross-sectional view of the semiconductor device taken along line X (shown in FIG. 1) after fabrication operations according to embodiments of the invention; and FIG. 17B depicts a cross-sectional view of the semiconductor device taken along line Y (shown in FIG. 1) after fabrication operations according to embodiments of the invention.

Figure 1:
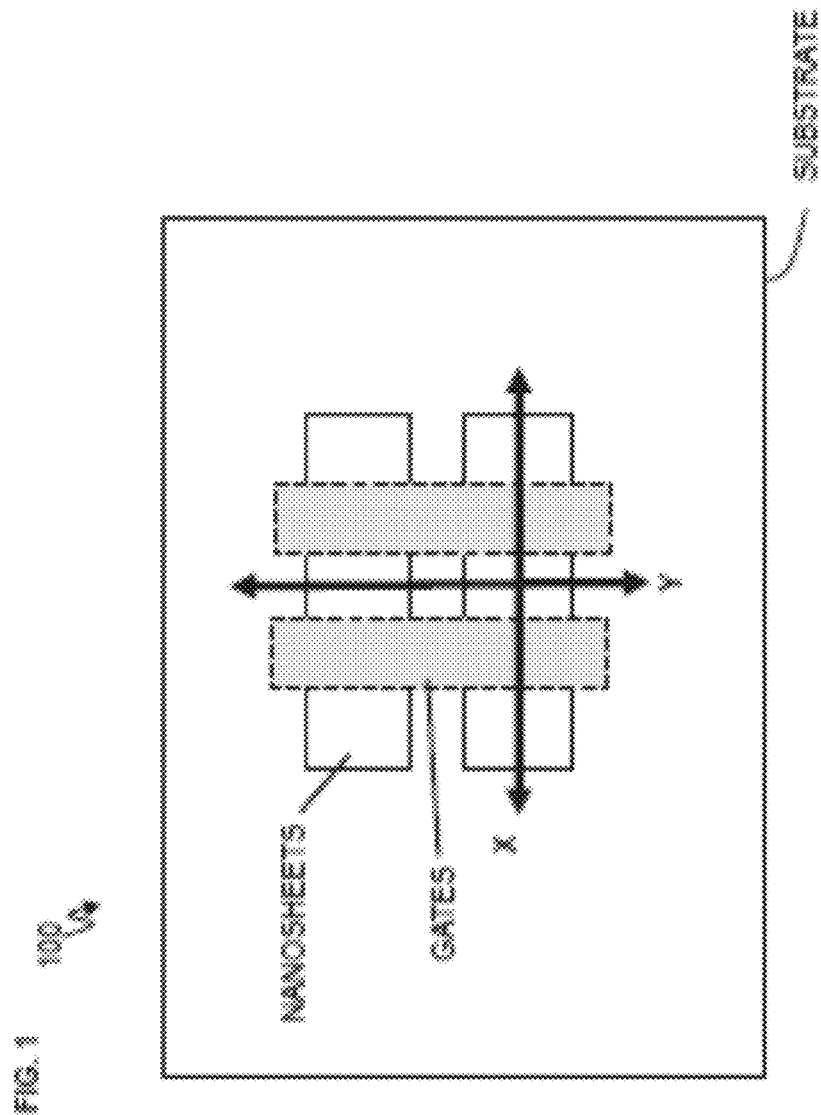
FIG. 1 depicts a simple diagram of a top view of a semiconductor device according to embodiments of the invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the embodiments of the invention, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, for nanosheet devices it may be beneficial to allow for back end of the line (BEOL) connections to be made on both the "top" and backside of the semiconductor devices. For example, herein disclosed is a semi-conductor device is formed that can allow at least one source/drain (S/D) epi to be connected to backside contact and one or more other S/D epi's to be connected on the front side. In one embodiment, a trench can be opened after HKMG formation, before MOL patterning (deep trench last flow) and prefilled with placeholder. The place holder is then opened at wafer backside and regrow S/D epitaxy with higher concentration. This trench epitaxy may have high dopant concentration that help to promote ohmic contact, that otherwise would not be formed at FEOL process without diffusion of dopants into adjacent channel region due to processes like HKMG annealing Turning now to a more detailed description of aspects of the present invention, FIG. 1 depicts a simple diagram of a top view of a semiconductor device 100 according to embodiments of the invention. FIG. 1 is only for reference and illustrates a top-down view locations of the nanosheets and future gates. For simplicity and ease of understanding, FIG. 1 omits some layers (elements) so as to not obscure the figure. FIG. 2A depicts a cross-sectional view of the semiconductor device 100 shown in FIG. 1 taken along line X according to embodiments of the invention. FIG. 2B depicts a cross-sectional view of the semiconductor device 100 shown in FIG. 1 taken along line Y according to embodiments of the invention.

Referring to FIG. 2A, the semiconductor device 100 includes substrate 202. The substrate 202 is formed of semiconductor material. The substrate 202 can be a silicon (Si) substrate, although other materials can be used.

The substrate 202 can include an etch stop layer 212 formed therein. The In one embodiment, this layer can be formed of SiGe or be a buried oxide (BOX) layer formed of silicon dioxide.

After initial fabrication processing, a sacrificial bottom isolation layer 204 is formed on top of the substrate 202 so as to be under an epitaxy nanosheet stack 250 (or fin-like structure). After forming the sacrificial bottom isolation layer 204, the epitaxy nanosheet stack 250 is then formed. The epitaxy nanosheet stack 250 includes sacrificial layers 206 alternatingly formed with channel layer 208A, 208B, and 208C. The channel layer 208A, 208B, and 208C can be generally referred to as channel layers 208. Although three channel layers 208 are shown, more or fewer channel layers 208 can be used, and the number of sacrificial layers 206 will be increased or decreased accordingly. The sacrificial bottom isolation layer 204, sacrificial layers 206, and channel layers 208 can be epitaxially grown.

The sacrificial bottom isolation layer 204 is a material that can be removed (i.e., etched) without etching the layers in the stack 250. That is, the sacrificial bottom isolation layer 204 can be etched/removed without removing the sacrificial layers 206 and the channel layers 208. The sacrificial bottom isolation layer 204 can be silicon germanium (SiGe). To cause the sacrificial bottom isolation layer 204 to be removed/etched without etching the other layers, the sacrificial bottom isolation layer 204 can be $SiGe_{y\ \%}$ where the atomic percent % for "y" ranges from 50-70% atomic percent. Particularly, y in $SiGe_{y\ \%}$ of sacrificial bottom isolation layer 204 can be about (or at least) 60% atomic percent such that the sacrificial bottom isolation layer 204 can be etched/removed without etching layers 206 and 208. In one embodiment, the sacrificial bottom isolation layer 204 is $SiGe_{55}$.

The material of the sacrificial layers 206 can also include $SiGe_{x\ \%}$ where the atomic percent % for "x" ranges from about 15-35% atomic percent (i.e., x is less than y). The material of the channel layers 208 can include Si. The thickness or height H1 of the sacrificial bottom isolation layer 204 can range from about 5 nm to 15 nm, the height H2 of each sacrificial layer 206 can be range from about 5 nm to 15 nm, and the height H3 of each channel layer 208 can range from about 5 nm to 15 nm. In one embodiment, the sacrificial layers 206 are $SiGe_{30}$.

Using semiconductor lithography, fin patterning and formation are performed by forming a fin hardmask 210 on top of the upper sacrificial layer 206. The fin hardmask 210 can be a nitride material, an oxide material, and/or a combination of oxide and nitride materials. Unprotected layers are etched so as to create fin-like structures down through the substrate 202 as can be seen in FIG. 2B.

FIG. 3A depicts a cross-sectional view of the semiconductor device 100 taken along line X according to embodiments of the invention. FIG. 3B depicts a cross-sectional view of the semiconductor device 100 taken along line Y according to embodiments of the invention. A shallow trench isolation region (STI) 302 is formed in the areas etched during fin formation, as best seen in FIG. 3B. The fin hardmask 210 is removed.

FIG. 4A depicts a cross-sectional view of the semiconductor device 100 taken along line X according to embodiments of the invention. FIG. 4B depicts a cross-sectional view of the semiconductor device 100 taken along line Y according to embodiments of the invention.

A dummy dielectric layer 402 is formed on top of the upper sacrificial layer 206. The dummy dielectric layer 402 can be an oxide, such as, $SiO_2$. Dummy gates 404 are formed on top of the dummy dielectric layer 402 as seen in FIG. 4A. The dummy gates 404 can be formed by depositing dummy gate material, such as, amorphous silicon or polycrystalline silicon (poly silicon), on top of the dummy dielectric layer 402. A gate hardmask 408 is formed on the dummy gate material. The gate hardmask 408 can be a nitride, oxide, and/or a combination of nitride and oxide multi-layer. In some implementations, a pad oxide 406 can be deposited on the dummy dielectric layer 402 prior to forming the gate hardmask 408. Gate patterning is formed by patterning the gate hardmask 408 and then using the patterned gate hardmask 408 to etch the dummy gate material into the dummy gates 404.

FIG. 5A depicts a cross-sectional view of the semiconductor device 100 taken along line X according to embodiments of the invention. FIG. 5B depicts a cross-sectional view of the semiconductor device 100 taken along line Y according to embodiments of the invention.

Portions of the dummy dielectric layer 402 not protected under the gate hardmask 408 are etched, while the protected portions remain. As discussed above, the sacrificial bottom isolation layer 204 is now removed. A selective etch of the sacrificial bottom isolation layer 204 (e.g., $SiGe_{y\ \%}$) is performed which does not remove the other layers, particularly sacrificial layers 206 (e.g., $SiGe_{x\ \%}$). Although both the sacrificial bottom isolation layer 204 and sacrificial layers 206 can be SiGe, the concentration or atomic percent of Ge is more in the sacrificial bottom isolation layer 204 than in the sacrificial layers 206 such that sacrificial bottom isolation layer 204 is etched without etching the sacrificial layers 206. An example etchant can be HCl or $ClF_3$.

Removal of the sacrificial bottom isolation layer 204 creates opening 502 underneath the nanosheet stack 250. Although the layers above the opening 502 appear to be floating, it noted that the layers (including the nanosheet stack 250) are anchored to the dummy gates 404. The opening 502 is created in preparation for a bottom dielectric isolation layer which is to isolate the source and drain regions as discussed herein.

FIG. 6A depicts a cross-sectional view of the semiconductor device 100 taken along line X according to embodiments of the invention. FIG. 6B depicts a cross-sectional view of the semiconductor device 100 taken along line Y according to embodiments of the invention.

Conformal deposition of low-k spacer material 604 is performed which simultaneously forms a bottom dielectric isolation layer 602. The bottom dielectric isolation layer 602 is formed in the previous space 502 (shown in FIGS. 5A, 5B). The low-k spacer material 604 pinches of the space/cavity 502 thereby forming the bottom dielectric isolation layer 602. The bottom dielectric isolation layer 602 is an SOI-like full isolation without requiring an SOI substrate. The low-k spacer material 604 of the bottom dielectric isolation layer 602 can be, for example, silicon boron carbide nitride (SiBCN). Other examples of the low-k spacer material 604 can include SiN, SiOC, SiOCN, SiOC, SiON etc. The bottom dielectric isolation layer 602 is the same height H1 as the previous sacrificial bottom isolation layer 204 which was removed to create space 502.

FIG. 7A depicts a cross-sectional view of the semiconductor device 100 taken along line X according to embodiments of the invention. FIG. 7B depicts a cross-sectional view of the semiconductor device 100 taken along line Y according to embodiments of the invention. Anisotropic spacer recess is performed using, for example, a directional RIE. This recesses the low-k spacer material 604 on the edges of the dummy gates 404 as shown in FIG. 7A and on the edges of the nanosheet stack 250 as shown in FIG. 7B. Also, a portion of the low-k spacer material 604 is pulled down from the top of the upper sacrificial layer 206 and removed from the STI material/regions 302. The thickness of bottom dielectric isolation layer 602 remains the same.

FIG. 8A depicts a cross-sectional view of the semiconductor device 100 taken along line X according to embodiments of the invention. FIG. 8B depicts a cross-sectional view of the semiconductor device 100 taken along line Y according to embodiments of the invention. Using the gate hardmask 408 and the low-k spacer material 604, an anisotropic fin recess is performed to recess/trim portions of the nanosheet stack 250 which are not protected. Directional RIE can be used during the fin recess. The bottom dielectric isolation layer 602 provides an etch stop for the fin recess, such that there is no substrate 202 over etch. In other words, the bottom dielectric isolation layer 602 protects the substrate 202 during the fin etch.

FIG. 9A depicts a cross-sectional view of the semiconductor device 100 taken along line X according to embodiments of the invention. FIG. 9B depicts a cross-sectional view of the semiconductor device 100 taken along line Y according to embodiments of the invention. Inner spacers 902 are formed as seen in FIG. 9A. For example, indentation of the sacrificial layers 206 is performed while etching selectively the sacrificial suspension layers 206 to the channel layers 208. As one example sufficient to etch the sacrificial layers 206 while not etching the channel layers 208, the sacrificial layers 206 can be $SiGe_{25\%}$ (e.g., the atomic percent for Ge is 25%) and the channel layers 208 can be Si. Indent cavities (not shown) are created from removing end portions of the sacrificial layers 206. The indent cavities are aligned to the bottom portions of the low-k spacer material 604 on the dummy gates 404. Conformal deposition of a dielectric material (e.g., low-k dielectric material) is performed to pinch off the indent cavities. An isotropic etch back (using a wet or dry process) of the dielectric material is performed to thereby form the inner spacers 902 inside the indent cavities. The low-k dielectric material of the inner spacers 902 can be a nitride based material.

FIG. 10A depicts a cross-sectional view of the semiconductor device 100 taken along line X according to embodiments of the invention. FIG. 10B depicts a cross-sectional view of the semiconductor device 100 taken along line Y according to embodiments of the invention. Formation of source or drain epitaxy 1002 is performed. The source or drain epitaxy 1002 can be NFET source/drain epitaxial regions or PFET source/drain epitaxial regions according to formation of the NFET or PFET devices. Accordingly, the source or drain epitaxy 1002 can be doped with N-type dopants or P-type dopants as desired. The source or drain epitaxy 1002 can be epitaxially grown from the edges of the channel layers 208.

An inter-level dielectric (ILD) material 1010 is then deposited to cap the source-drain epitaxy 1002. The ILD material 1010 is a low-k dielectric material such as, for example, an oxide material like silicon dioxide. The ILD material 1010 is then recessed by chemical mechanical polishing (CMP) until the gate hardmask layer 408 is reached.

Further, a replacement metal gate (RMG) process is performed. First, the gate hard mask 408 and pad oxide 406 are removed. An etch is then performed to selectively remove the dummy gate 404. The dummy dielectric layer 402 is etched, and finally the sacrificial suspension layers 206 are selectively etched to release the channel layers 208. The selective etch of the sacrificial suspension layers 206 creates openings between the channel layers 208. Conformal high-k metal gate (HKMG) formation is then performed to deposit HKMG layers 1004 which fill the previous locations of the sacrificial layers 206, so as to wrap around the channel layers 208. Optionally, a metal layer 1006 can be formed on the HKMG layers 1004. The metal layer 1006 can include tungsten (W). A self-aligned contact (SAC) cap 1008 is formed on top of the HKMG layers 1004. The SAC cap 1008 is an insulating material, such as, a nitride (e.g., SiN), an oxide (e.g., $SiO_2$), etc.

Techniques for forming HKMG in gate openings are well-known in the art and, thus, the details have been omitted in order to allow the reader to focus on the salient aspects of the disclosed methods. However, it should be understood that such HKMG will generally include formation of one or more gate dielectric layers (e.g., an inter-layer (IL) oxide and a high-k gate dielectric layer), which are deposited so as to line the gate openings, and formation of one or more metal layers, which are deposited onto the gate dielectric layer(s) so as to fill the gate openings. The materials and thicknesses of the dielectric and metal layers used for the HKMG can be preselected to achieve desired work functions given the conductivity type of the FET. To avoid clutter in the drawings and to allow the reader to focus on the salient aspects of the disclosed methods, the different layers within the HKMG stack 1004 are not illustrated. For explanation purposes, a high-K gate dielectric layer can be, for example, a dielectric material with a dielectric constant that is greater than the dielectric constant of silicon dioxide (i.e., greater than 3.9). Exemplary high-k dielectric materials include, but are not limited to, hafnium (Hf)-based dielectrics (e.g., hafnium oxide, hafnium silicon oxide, hafnium silicon oxynitride, hafnium aluminum oxide, etc.) or other suitable high-k dielectrics (e.g., aluminum oxide, tantalum oxide, zirconium oxide, etc.). Optionally, the metal layer(s) can include a work function metal that is immediately adjacent to the gate dielectric layer and that is preselected in order to achieve an optimal gate conductor work function given the conductivity type of the nanosheet-FET. For example, the optimal gate conductor work function for the PFETs can be, for example, between about 4.9 eV and about 5.2 eV. Exemplary metals (and metal alloys) having a work function within or close to this range include, but are not limited to, ruthenium, palladium, platinum, cobalt, and nickel, as well as metal oxides (aluminum carbon oxide, aluminum titanium carbon oxide, etc.) and metal nitrides (e.g., titanium nitride, titanium silicon nitride, tantalum silicon nitride, titanium aluminum nitride, tantalum aluminum nitride, etc.). The optimal gate conductor work function for NFETs can be, for example, between 3.9 eV and about 4.2 eV. Exemplary metals (and metal alloys) having a work function within or close to this range include, but are not limited to, hafnium, zirconium, titanium, tantalum, aluminum, and alloys thereof, such as, hafnium carbide, zirconium carbide, titanium carbide, tantalum carbide, and aluminum carbide. The metal layer(s) can further include a fill metal or fill metal alloy, such as tungsten, a tungsten alloy (e.g., tungsten silicide or titanium tungsten), cobalt, aluminum or any other suitable fill metal or fill metal alloy.

It should be appreciated that various modifications can be made to the integration method to form a full bottom dielectric isolation of the nanosheet FET and/or FinFET, according to embodiments of the invention.

Portions of the foregoing discussion are further amplified in U.S. Pat. No. 10,903,315 which is incorporated herein by reference in its entirety. It should be noted, however, that the substrate in the prior description differs from U.S. Pat. No. 10,903,315 in that it contains the etch stop layer 212. As further shown below, this layer can aid in creating a device that can have electrical connections on both sides.

The following description starts from FIGS. 11A/11B and provides a method by which one of the source-drain epitaxy 1002 is partially removed for wafer backside trench epitaxy growth, which is connected to backside metallization through backside contact.

In the foregoing figures, the process can be described generally as forming the gate, source and drain, the ILD and the replacement gate. The following description will detail how create a backside connection and can include one or more of forming backside contact trench opening through a S/D region, forming sacrificial material in the backside contact trench opening, forming middle of the line (MOL) structures, forming back end of line (BEOL) structures and bonding a carrier wafer. The method can further include flipping the wafer, removing the substrate, forming backside ILD, removing the sacrificial material in the backside contact trench opening, growing trench epi, and forming backside contact metallization.

FIGS. 11A and 11B show the device after a backside contract trench 1102 has been formed. This can include depositing an organic planarization layer (OPL) 1104 over the device 100 and then forming the trench 1102 therein. This may be accomplished using know techniques. The trench 1102 passes into the substrate 202 such that forms a recess in therein but does not reach the etch stop layer 212.

The OPL 1104 layer can then be removed and the trench 1102 at least partially filled with a sacrificial material 1202 as shown in FIGS. 12A and 12B. The sacrificial material 1202 can be for example, $TiO_x$, SiC, etc.

As shown in FIGS. 12A and 12B, the remaining region trench 1102 not filled by the sacrificial material 1202 can be filled by more ILD 1010. Further, S/D contacts 1012 can be formed through the ILD. In particular, trench contact formation is performed in the ILD material 1010 over the source and drain epitaxy 1002, and the source and drain contacts 1012 are formed. The source and drain contacts 1012 can be referred to as trench silicide (TS) contacts. The material of the source and drain contacts 1012 can include one or more layers. The source and drain contacts 1012 can be a Ti/TiN stack in which the titanium (Ti) is deposited first and titanium nitride (TiN) second. Other materials of the source and drain contacts 1012 can be tungsten (W) for instance.

While not shown in the particular views herein, it shall be understood that gate contacts that allow connection to the gates can be made through cap 1008.

A back end of the line (BEOL) layer 1302 can then be connected so that electrical contact can be made to the S/D contacts 1012 and the gate contact. The BEOL layer 1302 can be carried by otherwise attached to a carrier wafer 1304.

In the process herein, the entire device 100 can then be flipped over to allow for further processing to allow for formation of backside trench epitaxy and for contact to be made to a S/D region from the bottom of the device 100. In this process, the portion of the substrate 202 below the etch stop layer 212 is removed. The etch stop layer 212 can compensate for any thickness variations generated during removal of the portion of the substrate 202 below the etch stop layer 212 during grinding and CMP operations.

As shown in FIGS. 13A and 13B, the etch stop layer 212 and the remaining portions of the substrate 202 can be removed. The etch stop layer 212 can be removed by a selective etch process (e.g. wet etch) to the remaining portions of the substrate 202. After removal of the etch stop layer 212, the depth of the remaining substrate layer 202 should be about the same across the wafer. The remaining portion of the substrate 202 can be removed by a selective etch process (e.g. wet etch) to the isolation layer 602, the sacrificial material 1202 and the STI regions 302.

A layer of ILD 1402 can then be deposited and a CMP process performed to fill the regions between the STI regions 302 and expose the sacrificial material 1202 as shown in FIGS. 14A and 14B.

As shown in FIGS. 15A and 15B, the sacrificial material 1202 can be removed. In one embodiment, the removal can be done with a selective etch process (e.g. reactive ion etch) that removes the sacrificial material 1202. As shown, the etch is not perfectly selective so that the region 1502 of the cavity 1504 formed by the removal that passes though the ILD 1402/STI region 302 is outwardly tapered (e.g. is wider at the bottom than further upwards in the orientation shown FIGS. 15A and 15B.

As shown in FIGS. 16A and 16B, a backside trench epitaxy 1602 is grown in cavity 1504. This epitaxy 1602 can contact the original S/D epitaxy 1002. As illustrated in FIG. 16A the backside trench epitaxy 1602 can have a flat "bottom" 1620 that contacts the ILD 1010. As best seen in FIG. 16B, the epitaxy 1602 may include a diamond top 1622 extending towards and possibly into the region 1502. This diamond top 1622 may contact the backside contact 1702 illustrated in FIGS. 17A and 17B. The trench epitaxy 1602 may have high dopant concentration than the original S/D epitaxy 1002 to promote ohmic contact, that otherwise would not be formed without diffusion of dopants into adjacent channel regions due to front end of line processes like HKMG annealing. This can be beneficial especially if the contact is connected to a power connection.

Backside metal contacts 1702 can be deposited to contact the trench epitaxy 1602. A backside ILD layer 1720 can then be provided through which a back side power rail 1722 transverses. The BSPR 1722 can have both power and ground contacts. For example, BSPR 1722' can be VDD and BSPR 1722" can be VSS in one embodiment. The BSPR 1722 can be connected to a back side power distribution network 1750 as shown in FIGS. 17A and 17B. In this manner, power can be provided to a backside trench epitaxy 1602 and signal can be provided to a another S/D epitaxy 1002. This can possibly reduce signal/power interference and reduce space constraints on the BEOL layer 1302.

Terms such as "epitaxial growth" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of forming a semiconductor device, the method comprising:
    providing a substrate that includes an etch stop layer disposed therein;
    forming a gate, a drain epitaxy region and a source epitaxy region on the substrate;
    forming a backside contact trench opening through one of the source epitaxy region or the drain epitaxy region;
    filling at least a portion of the backside contact trench with a sacrificial material;
    attaching a carrier wafer over the gate, the drain epitaxy region and the source epitaxy region;
    removing the substrate;
    forming a backside ILD on a bottom of the device such that the sacrificial material is exposed to produce an intermediate workpiece;
    removing the sacrificial material to form a cavity;
    growing backside trench epitaxy in the cavity; and
    forming backside contact metallization.

2. The method of claim 1, wherein the backside trench epitaxy has a diamond tip.

3. The method of claim 1, further comprising:
    forming an organic planarization layer over gate, drain and source epitaxy regions before forming the backside contact trench opening.

4. The method of claim 3, further comprising: filling an unfilled portion of the backside contact trench opening with an interlayer dielectric.

5. The method of claim 4, further comprising:
    forming metal contacts to contact the gate and one of the source region and the drain region.

6. The method of claim 5, further comprising, before attaching the carrier wafer, attaching a back end of line (BEOL) layer such that it is in electrical contact with the metal contact that contacts the gate.

7. The method of claim 6, further including flipping the intermediate workpiece over before attaching the BEOL layer.

8. The method of claim 5, wherein metal contact that contacts one of the source epitaxy region or the drain epitaxy region is formed as a Ti/TiN stack or is formed of tungsten.

9. The method of claim 1, wherein the sacrificial material is one of $TiO_x$, or SIC.

10. The method of claim 1, wherein the backside trench epitaxy in the cavity has a higher dopant concentration than the source or drain epitaxy.

11. The method of claim 1, further comprising:
    connecting the backside contact metallization to a power contact that is part of a backside power distribution network.

* * * * *